US 7,759,598 B2

(12) United States Patent
Sugawara et al.

(10) Patent No.: US 7,759,598 B2
(45) Date of Patent: Jul. 20, 2010

(54) SUBSTRATE TREATING METHOD AND PRODUCTION METHOD FOR SEMICONDUCTOR DEVICE

(75) Inventors: Takuya Sugawara, Yamanashi (JP);
Seiji Matsuyama, Amagasaki (JP);
Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 383 days.

(21) Appl. No.: 11/790,463

(22) Filed: Apr. 25, 2007

(65) Prior Publication Data
US 2007/0235421 A1    Oct. 11, 2007

Related U.S. Application Data

(62) Division of application No. 10/500,214, filed as application No. PCT/JP02/13550 on Dec. 25, 2002, now Pat. No. 7,226,848.

(30) Foreign Application Priority Data
Dec. 26, 2001    (JP)    ............... 2001-394546

(51) Int. Cl.
*B23K 10/00*    (2006.01)
(52) U.S. Cl. ............... 219/121.35; 219/121.43; 219/121.44; 156/345.41; 156/345.37; 118/723 MW
(58) Field of Classification Search ............ 219/121.43, 219/121.4, 121.44; 118/723 R, 723 I; 156/345.41, 156/345.36; 438/475, 513, 520, 528, 585; 257/E21.324, E21.497
See application file for complete search history.

(56) References Cited

U.S. PATENT DOCUMENTS

| 4,605,447 | A | 8/1986 | Brotherton et al. |
| 4,908,329 | A | 3/1990 | Kanai et al. |
| 5,543,336 | A | 8/1996 | Enami et al. |
| 5,744,202 | A | 4/1998 | Nickel |
| 5,776,804 | A | 7/1998 | Hayashi |
| 5,956,581 | A | 9/1999 | Yamazaki et al. |
| 6,028,015 | A | 2/2000 | Wang et al. |

(Continued)

FOREIGN PATENT DOCUMENTS

CN    1038469 A    1/1990

(Continued)

OTHER PUBLICATIONS

Y. Aoki, et al., "In Situ Substrate Surface Cleaning by Low-Energy Ion Bombardment for High Quality Thin Film Formation", J. Vac. Sci. Technol. A, Mar./Apr. 1993, pp. 307-313, vol. 11 No. 2, American Vacuum Society.

(Continued)

*Primary Examiner*—Mark H Paschall
(74) *Attorney, Agent, or Firm*—Crowell & Moring LLP (57) ABSTRACT

A method for hydrogen sintering a substrate including a semiconductor device formed thereon comprises the steps of exciting a processing gas comprising a noble gas and a hydrogen gas to form a plasma comprising hydrogen radicals and hydrogen ions, and exposing the substrate to the plasma. A preferred method comprises forming a gate insulation film on a substrate, forming a polysilicon electrode on the gate insulation film, and exposing the polysilicon electrode to an atmosphere comprising hydrogen radicals and hydrogen ions.

3 Claims, 9 Drawing Sheets

U.S. PATENT DOCUMENTS

| | | |
|---|---|---|
| 6,258,640 B1 | 7/2001 | Miyazaki |
| 2003/0160304 A1 | 8/2003 | Ohmi et al. |
| 2004/0050494 A1 | 3/2004 | Ohmi et al. |

FOREIGN PATENT DOCUMENTS

| | | |
|---|---|---|
| EP | 129265 | 12/1984 |
| JP | 58-106837 | 6/1983 |
| JP | 59-213137 A | 12/1984 |
| JP | 1-214123 | 8/1989 |
| JP | 3-286535 | 12/1991 |
| JP | 10-12625 | 1/1998 |
| JP | 11-330080 | 11/1999 |
| JP | 2000-260767 A | 9/2000 |
| JP | 2000-294550 A | 10/2000 |
| JP | 2001-223361 A | 8/2001 |
| JP | 2002-25874 A | 1/2002 |
| JP | 2002-299330 A | 10/2002 |
| WO | WO98/33362 A1 | 7/1998 |

OTHER PUBLICATIONS

Katsuyuki Sekine, et al., "Silicon Nitride Film Growth for Advanced Gate Dielectric at Low Temperature Employing High-Density and low-Energy Ion Bombardment", J. Vac. Sci. Technol. A, Sep./Oct. 1999, pp. 3129-3133, vol. 17, No. 5, American Vacuum Society.

Kotaro Miyatani, et al., "A New Plasma Dry Cleaning Method Applied to Contact and Gate Pre Cleaning", Extended Abstracts of the 2002 International Conference on Solid State Devices and Materials, 2002, pp. 196-197, Nagoya.

N. Sano, et al., "Improvement of $SiO_2$/Si Interface by Low-Temperature Annealing in Wet Atmosphere", Appl. Phys. Lett., Apr. 17, 1995, pp. 2107-2109, vol. 66, No. 16, American Institute of Physics.

D. Tchikatilov, et al., "Improvement of SiGe Oxide Grown by Electron Cyclotron Resonance Using $H_2O$ Vapor Annealing", Appl. Phys. Lett., Oct. 21, 1996, pp. 2578-2580, vol. 69, No. 17, American Institute of Physics.

Takuya Sugawara, et al., "Characterization of Ultra Thin Oxynitride Formed by Radical Nitridation with Slot Plane Antenna Plasma", Extended Abstracts of the 2002 International Conference on Solid Devices and Materials, 2002, pp. 714-715, Nagoya.

Akiko Nara, et al., "A Guideline for Accurate Two-Frequency Capacitance Measurement for ultra-Thin Gate Oxides", Extended Abstracts of the 2002 International Conference on Solid Devices and Materials, 2002, pp. 452-453, Sendai.

Atsuhiro Tsukune, et al., "Cu Damascene Formation Process", The $8^{th}$ Semiconductor Process Symposium, Sep. 20, 1999, pp. 71-79.

T. Ngal et al., "Improving $SiO_2$/SiGe intface of SiGe p-metal-oxide-silicon field-effect transistors using water vapor annealing", Applied Physics Letters, vol. 80, No. 10, Mar. 11, 2002, pp. 1773-1775.

Japanese Office Action dated Oct. 2, 2007 (Two (2) pages).

Chinese Office Action dated Feb. 20, 2009 with English translation (five (5) pages).

H2/Ar = 1%, PRESSURE = XmTorr

SUBSTRATE TREATING METHOD AND PRODUCTION METHOD FOR SEMICONDUCTOR DEVICE

CROSS-REFERENCE TO RELATED APPLICATIONS

This application is a division of U.S. patent application Ser. No. 10/500,214, filed Mar. 17, 2005, which is the National Phase of International Application PCT/JP02/013550, filed Dec. 25, 2002. This application claims priority from Japanese patent application Serial No. 2001-394546 filed Dec. 26, 2001, the entire contents of which are expressly incorporated herein by reference.

TECHNICAL FIELD

The present invention generally relates to fabrication of electronic devices, and more particularly, to a substrate processing method in which a substrate for an electronic device on which substrate a semiconductor device is formed is exposed to hydrogen radicals.

BACKGROUND ART

In the fabrication process of a semiconductor device, it is indispensable to perform a hydrogen sintering process which performs thermal processing on a substrate for an electronic device on which substrate various semiconductor devices are formed in a hydrogen atmosphere. By performing such a hydrogen sintering process, in a MOSFET (Metal-Oxide-Semiconductor Field Effect Transistor), for example, dangling bonds at the interface region between a channel substrate and a gate insulation film are terminated with hydrogen radicals, and degradation of the electric properties of the semiconductor devices caused by capturing of electric charges by the dangling bonds is suppressed.

There are various semiconductor devices that use a hydrogen sintering process. Specific examples of such semiconductor devices are: a logical device that requires a high-speed operation; a memory device represented by DRAM using a high dielectric constant material (High-k) as an interelectrode insulating film; and a TFT (Thin Film Transistor) formed on a glass substrate. A description is given below of the reason the semiconductor devices require a hydrogen sintering process.

On the other hand, a high dielectric constant material (High-k) such as $Ta_2O_5$ is used as an interelectrode insulating film used for a memory cell of DRAM. However, when a semiconductor device including such a high dielectric constant material is processed (e.g., etching or a hydrogen sintering process) under a condition where a large quantity of hydrogen radicals exist, degradation of characteristics such as an increase in leakage current and a reduction of dielectric constant tend to occur (refer to Atsuhiro Tsukune, "Cu Damascene Formation Process", The 8th semiconductor process symposium, Sep. 20, 1999, pp. 71-79).

In addition, since a TFT is formed on a glass substrate, it is essential to perform a process at low temperature of 400° C. or less. However, it is difficult to form an oxide film having good characteristics in such a temperature region by thermal oxidation. Thus, at present, an oxide film formed by CVD or plasma oxidation is used as a gate insulation film. However, the insulating property of the oxide film fabricated by such methods is significantly inferior to that of a thermal oxide film, and a problem of an increase in energy consumption due to an increase of leakage current occurs, which is disadvantageous for application to a mobile terminal requiring low electric power consumption (refer to N. Sano, M. Sekiya, M. Hara, A. Kohno and T. Sameshima, "Improvement of $SiO_2$/Si interface by low-temperature annealing in wet atmosphere", Applied Physics Letters, volume 66, Number 16, 1995, pp. 2107-2109).

In order to improve the characteristics of such a gate insulation film, a hydrogen sintering process by thermal processing has been used. However, when forming hydrogen radicals by heat treating, high temperature of 450° C. or more is required. Hence, application to a SiGe substrate and a TFT, which require low temperature processing, is difficult. Additionally, in a case where a hydrogen sintering process by thermal processing is used, hydrogen radicals are mainly controlled by temperature. However, in formation of a semiconductor device in which a heat-resistant material (a material having high heat stability) and a material easily affected by heat (a material having low heat stability) are mixed, it is difficult to establish an optimum process. Further, though High-k materials used as an interelectrode insulation film of a DRAM are promising for the next generation gate insulation film, the materials have a problem of, for example, an increase in the thickness of an oxide film due to crystallization or reaction to silicon when subjected to a high-temperature process after formation of the film. Hence, it is anticipated that it will be difficult to use a hydrogen sintering process using heat on a semiconductor device mounting thereon a High-k gate insulating film.

Wet annealing, which perform annealing in a $H_2O$ atmosphere of about 300° C., has been proposed as a process covering the above-mentioned shortcomings (Sano et al., op cit., and D. Tchikatilov, Y. F. Yang and E. S. Yang, Appl. Phys. Lett. 69 (17) 21 Oct. 1996). However, since the time period of annealing is about three hours, which is a long time, it seems that using wet annealing for mass production is difficult.

Therefore, a method using plasma, which can easily form and control hydrogen radicals at a low temperature of 400° C., is drawing attention as a most promising method for forming hydrogen radicals. There have already been reported a large number of hydrogen radical formations using plasma. However, these plasma processes are techniques developed with the aim of cleaning (Y. Aoki, S. Aoyama, H. Uetake, K. Morizuka and T. Ohmi, "In situ substrate surface cleaning by low-energy ion bombardment for high quality film formation", J. Vac. Sci. Technol. A11(2), March/April 1993, pp. 307-313), and have problems of, for example, plasma damage due to high electron temperature and difficulty in increasing the area processed.

On the other hand, recently, there has been proposed a plasma formation method, which uses a planar antenna and microwaves, as a plasma processing method intended to form a gate insulation film.

In the method, a noble gas of, for example, He, Ne, Ar, Kr and Xe is supplied together with a gas including oxygen or nitrogen via a ring shower plate provided above a substrate to be processed to the space between the substrate to be processes and the shower plate. By emitting microwaves from behind a planar antenna member (slot plane antenna; SPA) provided above the shower plate, the microwaves are propagated via the antenna. A technique has been proposed in which a noble gas is plasma-excited in the above-mentioned space by using the microwaves, and at the same time, radicals of a gas including oxygen or a gas including nitrogen, for example, oxygen radicals O* or nitrogen radicals N*, are formed, thereby oxidizing or nitriding a surface of a silicon substrate.

Since the electron density of the plasma formed by this method is high, a large volume of radicals is formed even at a low substrate processing temperature. In addition, since the electron temperature is low, plasma damage, which becomes a problem in other plasma formation methods, is low. Further, since the microwaves propagated via the planar antenna uniformly form plasma in a large area, it is reported that good application is obtained with respect to a substrate having a large area such as a wafer having a diameter of 300 mm and a TFT display apparatus substrate (Katsuyuki Sekine, Yuji Saito, Masaki Hirayama and Tadahiro Ohmi, J. Vac. Sci. Technol. A17(5), September/October 1999, pp. 3129-3133).

With the use of such a technique, it is possible to directly perform an oxidizing or nitriding process on a surface of a substrate for electronic devices even at a low substrate temperature of 400° C. or less.

DISCLOSURE OF THE INVENTION

Recently, aiming at high-speed logic devices, MOSFETs using as a substrate a SiGe (Silicon Germanium) crystal film deposited on a Si wafer have been developed. Since the mobility of p-channels is increased by using a SiGe crystal film as a channel layer, realization of high-speed MOSFETs is expected.

When such a structure is used, it is necessary to form an oxide film on a SiGe crystal film as a gate insulating film. However, formation of a gate oxide film by thermal oxidation causes formation of a mixed layer of $SiO_2$ and $GeO_2$, which results in degradation of the insulating property compared to a pure $SiO_2$ film. Thus, formation of an oxide film by CVD (Chemical Vapor Deposition), which allows formation of an oxide film at low temperature, and by plasma oxidation has been attempted. The insulating property of the oxide films thus formed is superior to that of the mixed layer of $SiO_2$ and $GeO_2$, but the insulating property thereof is inferior compared to that of a pure thermal oxide film. For this reason, operating characteristics that can be put into practical use are not obtained (refer to T. Ngal, X. Chen, J. Chen, S. K. Banerjee, "Improving $SiO_2$/SiGe interface of SiGe p-metal-oxide-silicon field-effect transistors using water vapor annealing", Applied Physics Letters, vol. 80, Number 10, 2002, pp. 1773-1775).

Accordingly, a general object of the present invention is to provide a novel and useful substrate processing method in which the problems described above are eliminated.

A more specific object of the present invention is to provide a method of processing with hydrogen radicals (including hydrogen ions) a substrate for an electronic device represented by, for example, a Si substrate, a SiGe substrate, and a glass substrate, wherein formation of hydrogen radicals is effectively controlled with a control method using other than temperature, for example, pressure or gas flow rate.

Still another object of the present invention is to provide a substrate processing method capable of performing a hydrogen sintering process at a low substrate processing temperature on a substrate for an electronic device, on which substrate a semiconductor element is formed, without damaging the substrate.

A further object of the present invention is to provide a substrate processing method capable of performing a hydrogen sintering process at a low substrate processing temperature on a substrate for an electronic device on which substrate a semiconductor device is formed, wherein the method is particularly preferably used for a SiGe substrate or a glass substrate whose characteristics are significantly degraded by heat.

A still further object of the present invention is to provide a substrate processing method capable of performing a hydrogen sintering process at a low substrate processing temperature on a substrate for an electronic device on which substrate a semiconductor device is formed, wherein the method is particularly preferably used for a semiconductor device such as a DRAM including as an interelectrode insulation film a High-k material that requires control of hydrogen radical generation by a method using other than heat and a next generation logic device including as a gate insulation film in a MOSFET a High-k material.

Another object of the present invention is to provide a fabrication method of a semiconductor device including a gate insulation film formed at low substrate temperature by, for example, a thermal CVD method, a plasma method, and a hot wire method, wherein dangling bonds that exist between a gate insulation film and a substrate, in the vicinity of the interface between a gate insulation film and a gate electrode, or in the gate insulation film or the gate electrode, are terminated by performing a hydrogen sintering process at low substrate processing temperature, thereby capable of compensating degradation in the electric properties of the semiconductor device.

Another object of the present invention is to provide a substrate processing method that exposes to hydrogen radicals (including hydrogen ions) a substrate for an electronic device on which substrate a semiconductor device is formed, wherein the hydrogen radicals are excited by plasma.

Another object of the present invention is to provide a substrate processing method that exposes to hydrogen radicals (including hydrogen ion) a substrate for an electronic device on which substrate a semiconductor device is formed, wherein the hydrogen radicals are excited by microwave plasma.

Another object of the present invention is to provide a substrate processing method that exposes to hydrogen radicals (including hydrogen ion) a substrate for an electronic device on which substrate a semiconductor device is formed, wherein the hydrogen radicals are excited by plasma formed by emitting microwaves to a planar antenna (Slot Plane Antenna: SPA).

As can be appreciated, the technique may be applied to the above-mentioned low temperature oxide film formation, and is also promising to be used as a hydrogen radical formation method aiming at hydrogen sintering.

BRIEF DESCRIPTION OF THE DRAWINGS

These objects and other objects and advantages of the present invention will become more apparent upon reading of the following detailed description and the accompanying drawings in which.

BEST MODE FOR CARRYING OUT THE INVENTION

First Embodiment

FIGS. 1A through 1H show a fabrication process of an n-MOSFET as a typical application of a hydrogen sintering process according to the present invention. FIG. 2 shows one embodiment of a plasma formation apparatus using microwaves and a planar antenna, which apparatus is a hydrogen radical formation apparatus used in the present invention.

First, referring to FIG. 2, a microwave plasma processing apparatus 10 includes a process chamber 11 provided with a substrate supporting table 12, which supports a substrate W to be processed. The process chamber 11 is evacuated via an exhaust port 11A.

An opening is formed in the process chamber 11 so as to correspond to the substrate W on the substrate supporting table 12. The opening is covered by a cover plate 13 made of a low-loss ceramic such as alumina. Further, a shower plate 14, which is made of a low-loss ceramic such as alumina and provided with a gas introducing path and a large number of nozzle openings communicating with the gas introducing path, is formed underneath the cover plate 13 so as to face the substrate W to be processed.

The cover plate 13 and the shower plate 14 form a microwave window. A microwave antenna 15 such as radial line slot antenna or a horn antenna is formed outside the cover plate 14.

At the time of operation, the process space inside the process chamber 11 is set to a predetermined processing pressure through evacuation via the exhaust port 11A. In the plasma processing method aiming at formation of a gate insulation film, an inert gas of, for example, argon or Kr is introduced with a gas including oxygen from the shower plate 14. Additionally, as is described below, in a plasma processing method proposed in the present invention and aiming at formation of hydrogen radicals, a hydrogen gas is preferably used as a gas that is introduced with the inert gas.

Further, microwaves having a frequency of several GHz are emitted from a top portion of the antenna 15. The emitted microwaves are propagated through the antenna in a diameter direction, emitted to a bottom portion of the antenna, and introduced into the process chamber 11 by being transmitted through the cover plate 13. On this occasion, since the microwaves are propagated via the antenna, plasma having high density and low electron temperature is generated, and the plasma is uniformly distributed in a wide region in proportion to the area of the antenna. Accordingly, with the use of the substrate processing apparatus of FIG. 2, it is possible to process a large area such as a wafer having a diameter of 300 mm and a large TFT display substrate. Also, since the electron temperature of the plasma is low, it is possible to prevent damage to the substrate W to be processed and an inner wall of the process chamber 11. Further, since the formed radicals flow in the diameter directions along the surface of the substrate W to be processed and are immediately exhausted, recombination of the radicals is suppressed and it is possible to perform an efficient and very uniform substrate process at a low temperature of 600° C. or less.

Figure 1A:
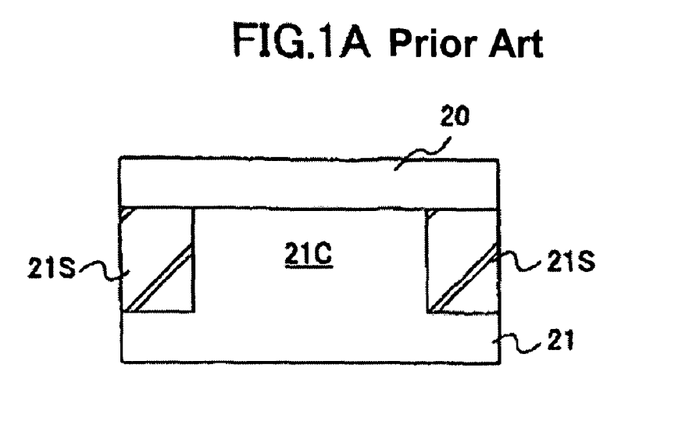
FIGS. 1A through 1H show a fabrication process of an n-MOSFET as a typical application of a hydrogen sintering process according to the present invention.
Figure 2:
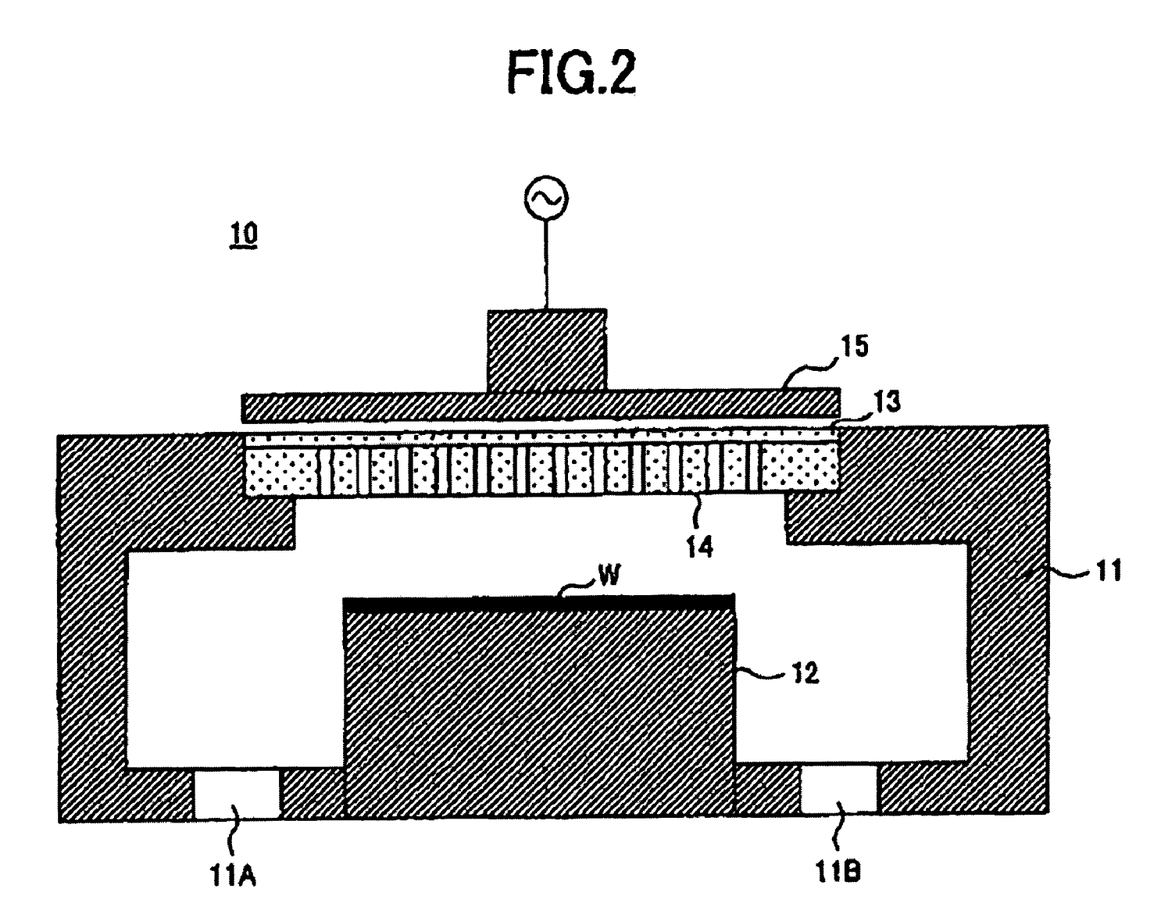
FIG. 2 is a diagram showing the structure of a microwave plasma processing apparatus used in the present invention.

Next, referring to FIGS. 1A through 1H, in the process of FIG. 1A, a p-type silicon substrate 21 having (100) surface orientation and a resistivity of 1-30 Ωcm is used as a substrate. A device isolation structure 21S is formed on the silicon substrate 21 by the STI or LOCOS process. Further, channel doping by boron is performed in a device region 21C defined by the device isolation structure 21S. In the process of FIG. 1A, a sacrificial oxide film 20 is formed on a surface of the silicon substrate 21 as a preliminary process for a gate insulation film formation process, which is to be performed later.

Figure 1B:
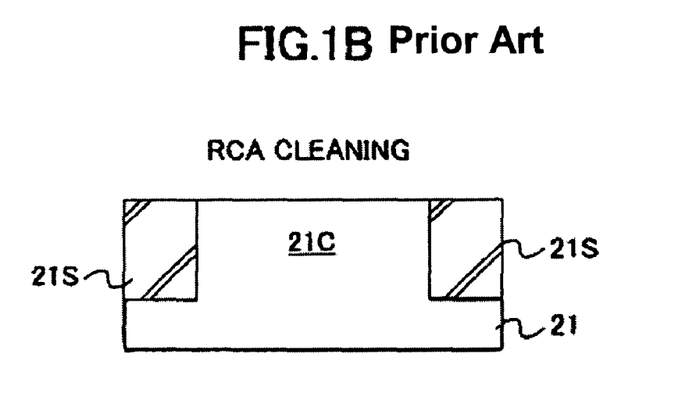

Next, in the process of FIG. 1B, RCA cleaning, combining an APM (mixture of ammonia, hydrogen peroxide, and deionized water), an HPM (mixture of hydrochloric acid, hydrogen peroxide, and deionized water), and a DHF (mixture of hydrofluoric acid and deionized water), is used to perform cleaning before gate insulation film formation with respect to the structure of FIG. 1A. Thereby, the sacrificial oxide film 20 is removed together with contaminants such as metals, organic matter, and particles, and a fresh surface of the silicon substrate 21 is exposed. In this process, according to need, a SPM (mixture of sulfuric acid and hydrogen peroxide), ozone water, an FPM (mixture of hydrofluoric acid, hydrogen peroxide, and deionized water), hydrochloric acid water (mixture of hydrochloric acid and deionized water), and organic alkali, for example, may be used.

Figure 1C:
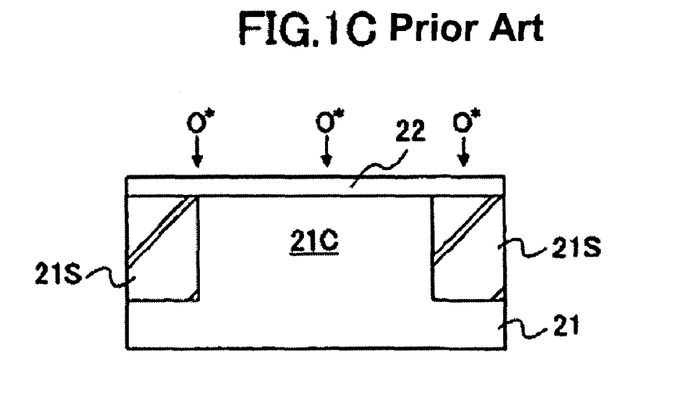

Next, in the process of FIG. 1C, a gate oxide film 22 is formed on the surface of the silicon substrate 21. For example, by performing an oxidizing process on the substrate subjected to the RCA cleaning shown in FIG. 1B for two minutes in an atmosphere having a pressure of 700 Pa and a $H_2/O_2$ gas flow ratio of 100/700 SCCM while maintaining temperature of the substrate at 850° C., a thermal oxide film having a thickness of about 2 nm is formed as the gate oxide film 22.

Figure 1D:
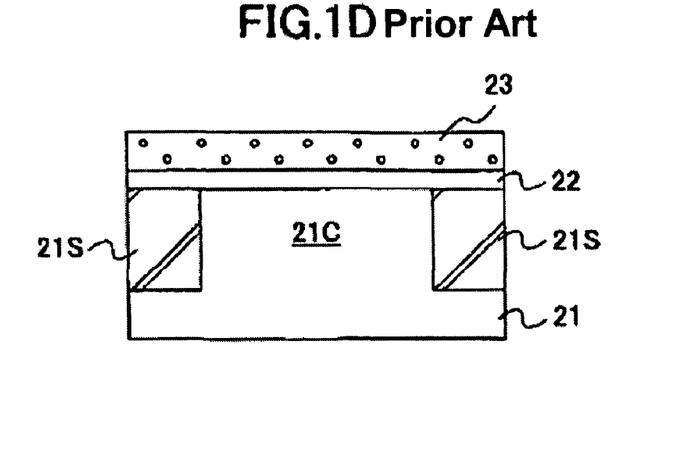

Next, in the process of FIG. 1D, a polysilicon film 23, which forms a gate electrode, is deposited by CVD method on the gate oxide film 22 of FIG. 1C. For example, by introducing a silane gas under a pressure of 30 Pa while maintaining the temperature of the silicon substrate 21, having the gate oxide film 22 formed thereon, at 620° C., the polysilicon film 23 is formed on the gate oxide film 22 with a thickness of 150 nm.

Figure 1E:
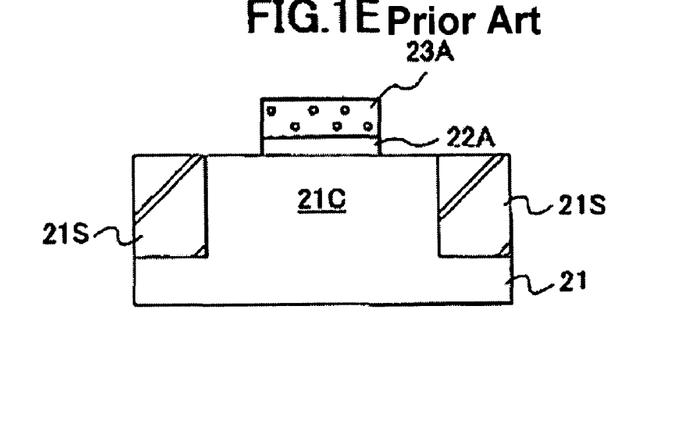

Then, in the process of FIG. 1E, by patterning the polysilicon film 23 by a resist process, a gate electrode pattern 23A and a gate oxide film pattern 22A are formed on the silicon substrate 21. Further, in the step of FIG. 1F, by performing ion implantation of a p-type impurity element such as As or P into the device region 21C, and subsequently performing activation of the implanted ion by thermal processing, n-type diffusion regions 21A and 21B, which serve as a source region and a drain region, are formed in the silicon substrate 21 on both sides of the gate electrode 23A.

Figure 1F:
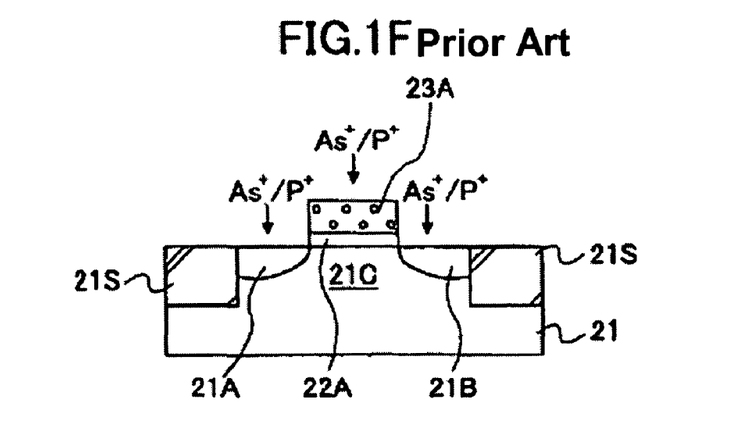
Figure 1G:
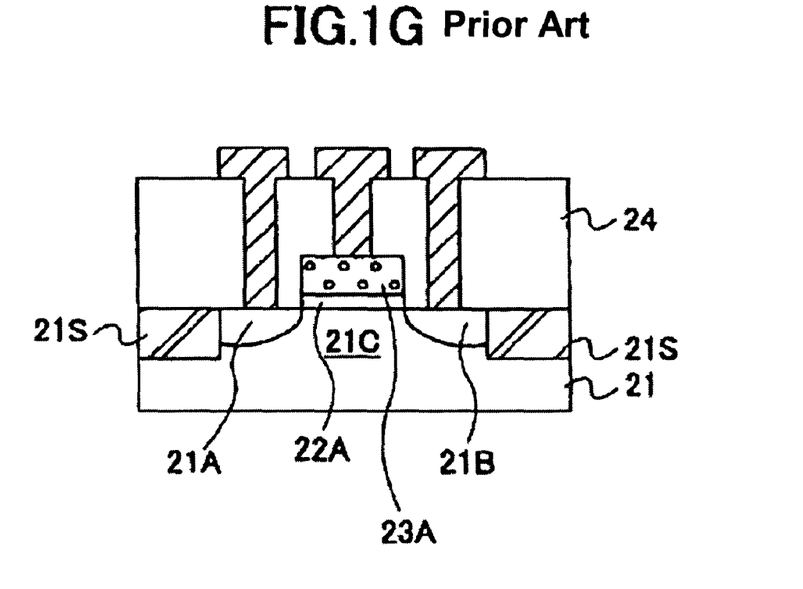

Further, in the step of FIG. 1G, an interlayer insulation film 24, which is formed by a low dielectric constant film such as TEOS, is formed on the structure of FIG. 1F so as to cover the gate electrode 23A. Additionally, contact holes exposing the diffusion regions 21A and 21B and the gate electrode 23A are formed in the interlayer insulation film 23 by selective etching. In addition, by filling the contact holes with an electrode material, which is indicated by oblique lines, a desired MOSFET is obtained.

Incidentally, when forming the MOSFET of FIG. 1G, plasma processing is used in selective etching and an ashing process used in a resist removing process. However, such plasma processing may cause degradation in the characteristics of a MOSFET in the vicinity of the interface between the gate oxide film 22 and the silicon substrate 21 such as an increase of the interface state. Hence, in a conventional fabrication process of a semiconductor device, a hydrogen sintering process is performed on the obtained semiconductor structure shown in FIG. 1G.

Figure 3:
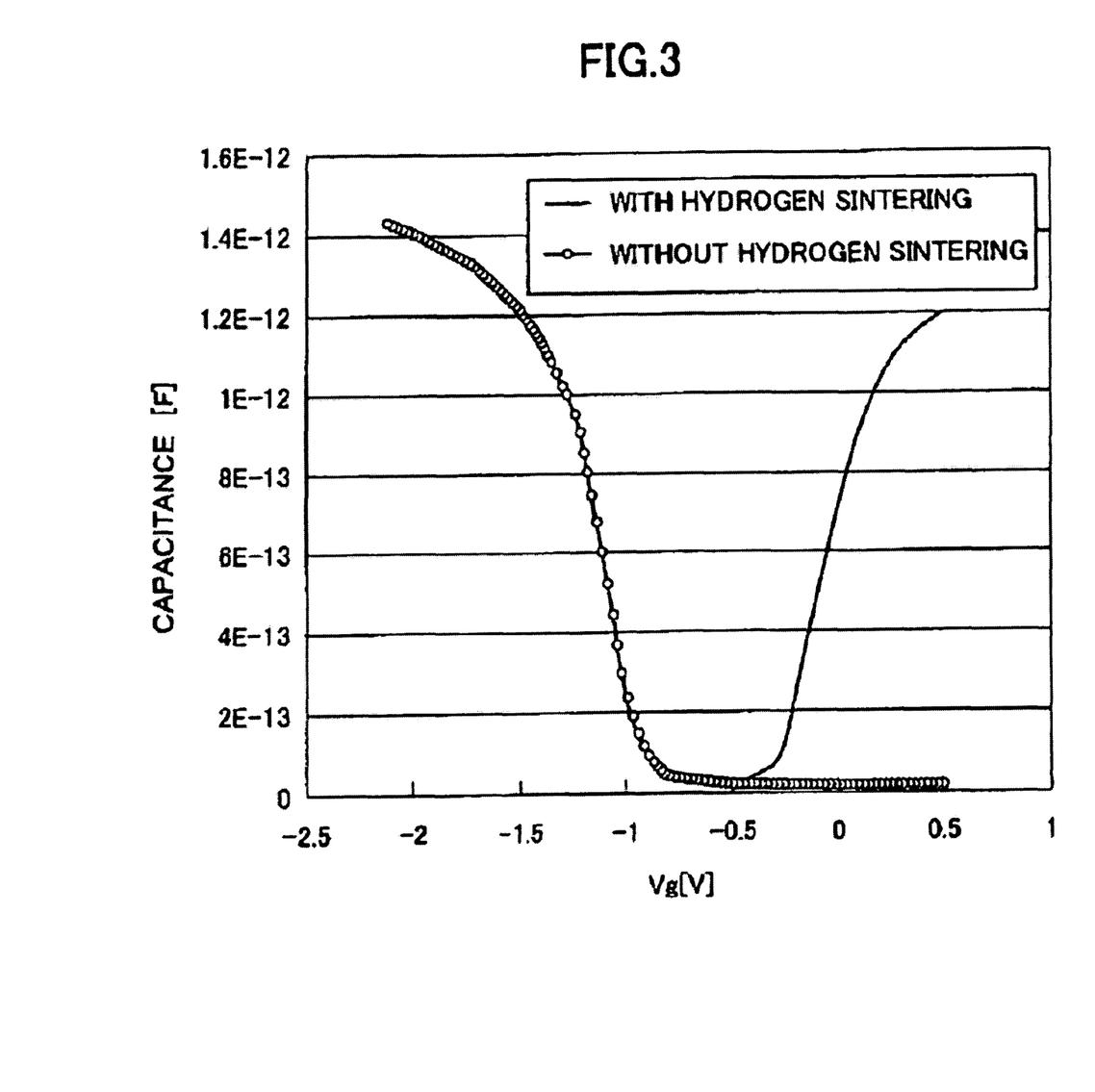
FIG. 3 is a diagram for explaining a problem that occurs in the fabrication process of the semiconductor device of FIGS. 1A through 1H.

FIG. 3 shows the C-V characteristics of a nMOS capacitor having a structure similar to that of FIG. 1E. It should be noted that, in FIG. 3, the vertical axis represents the capacitance of the nMOS capacitor formed by the p-type silicon substrate 21, the gate oxide film 22, and the n-type polysilicon gate electrode 23A, and the horizontal axis represents the gate voltage applied to the polysilicon gate electrode 23A. It should be noted that, in the example shown in FIG. 3, the analysis was made by using two-frequency analysis, which uses measuring frequencies of 100 kHz and 250 kHz, with the area of the gate oxide film 22 being 100 μm² (Akio Nara, Naoki Yasuda, Hideki Satake and Akira Toriumi, "A Guidance for Accurate Two-Frequency Capacitance Measurement for Ultra-Thin Gate Oxide", Extended Abstracts of Solid State Devices and Materials, 2000, pp. 452-453).

Referring to FIG. 3, in a case where the hydrogen sintering process described above is not performed, in a depletion region corresponding to a gate voltage of −0.5 V-+0.5 V, the existence of a large capacitance due to the interface state is confirmed.

Figure 1H:
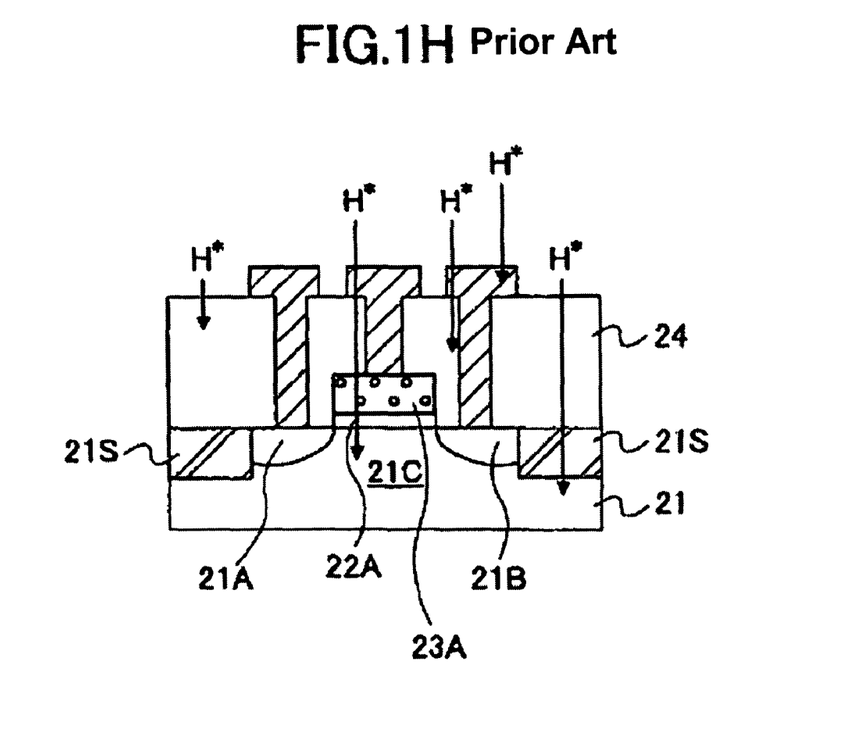

On the other hand, in a case where the hydrogen sintering process shown in FIG. 1H is performed by heating the structure of FIG. 1G to a temperature of 450° C. and leaving the structure in an atmosphere having a $H_2/N_2$ ratio of 0.5% for 30 minutes, it can be seen that the capacitance due to the interface state in the depletion region is reduced as shown in FIG. 3, and good C-V characteristics are obtained.

As mentioned above, in order to fabricate a MOSFET having good interface characteristics, a hydrogen sintering process shown in FIG. 1H is indispensable. However, a conventional hydrogen sintering process by heat processing needs a high temperature of 400° C. or more, and it is becoming difficult to preferably use a hydrogen sintering process by heat processing for fabrication of a TFT using a glass substrate and a semiconductor device such as a DRAM in which a material having superior heat stability and a material having inferior heat stability are mixed.

Figure 4:
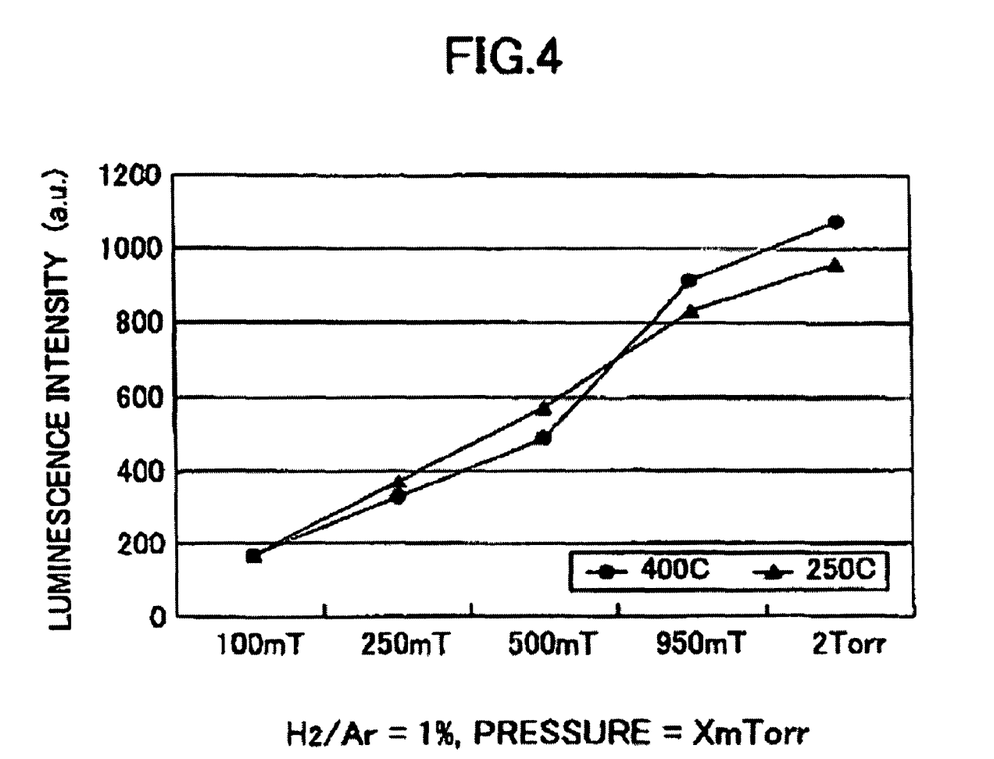
FIG. 4 is a diagram for explaining a first embodiment of the present invention.

FIG. 4 shows a hydrogen radical control method according to the first embodiment of the present invention, using the substrate processing apparatus 10 of FIG. 2. It should be noted that, in FIG. 4, the horizontal axis represents the processing pressure, and the vertical axis represents the luminescence intensity of hydrogen radicals observed by OES (Optical Emission Spectroscopy). It should be noted that, in the experiment of FIG. 4, the ratio of hydrogen gas supplied to the shower plate 14 of FIG. 2 with respect to Ar gas is 1%, and microwaves of 2.45 GHz are emitted to the antenna 15 at a power of 2000 W.

Referring to FIG. 4, it can be seen that luminescence intensity equivalent to that in a case where a substrate temperature is 400° C. is obtained at a substrate temperature of 25° C., and it is possible to generate enough hydrogen radicals even at low substrate temperature by forming hydrogen radicals with the use of the substrate processing apparatus 10 of FIG. 2. Additionally, it can be seen from FIG. 4 that the amount of the formed hydrogen radicals drastically varies by changing the processing pressure. For example, it can be seen that, by changing the processing pressure from 13.3 Pa (100 mTorr) to 267 Pa (2 Torr), the luminescence intensity of hydrogen radicals is increased to five times. This indicates a possibility that the generation amount of hydrogen radicals can be controlled by a method other than conventional temperature control. Particularly, the relationship shown in FIG. 4A indicates that, by controlling the processing pressure in the substrate processing apparatus 10, even at a low substrate temperature of 250° C., the generation amount of hydrogen radicals can be controlled in a manner similar to that in the case where the substrate temperature is 400° C. and furthermore arbitrarily.

Figure 5:
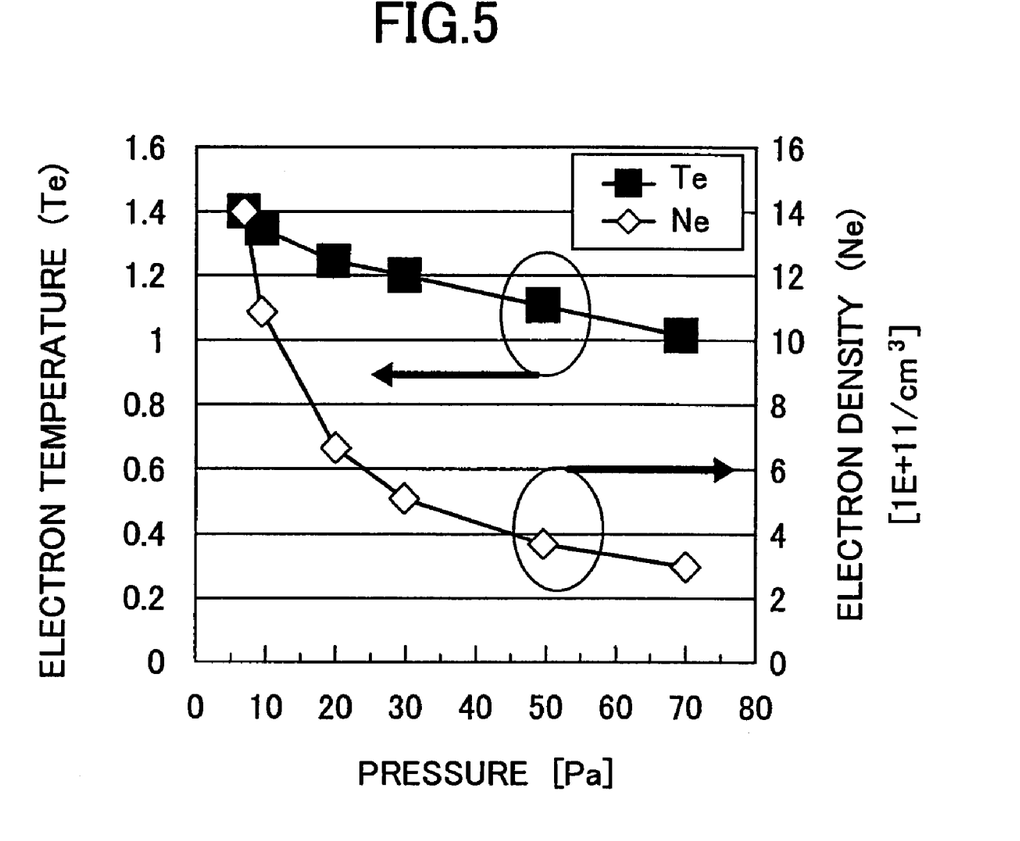
FIG. 5 is another diagram for explaining the first embodiment of the present invention.

FIG. 5 shows the relationship between the electron temperature and the electron density measured in the substrate processing apparatus 10 of FIG. 2.

Referring to FIG. 5, it can be seen that, with the use of the substrate processing apparatus 10 of FIG. 2, it is possible to form plasma having an electron temperature of 1.5 eV or less with an electron density of $10^{11}$ cm$^{-3}$. This means that, according to the present invention, it is possible to form a sufficient amount of hydrogen radicals under a condition where the electron temperature is lower than that in other plasma formation methods, and thus with less plasma damage occurring.

As mentioned above, in the present invention, by forming plasma with the use of the substrate processing apparatus 10 of FIG. 2 at the time of formation of hydrogen radicals, it is possible to control the electron temperature of the formed plasma. Also, it is possible to prevent a problem of damage to a semiconductor device caused by charged particles, which is considered to occur when other plasma formation methods are used.

In the present embodiment, the generation amount of hydrogen radicals is controlled by controlling the pressure. However, the generation amount of hydrogen radicals may be controlled also by varying the gas flow rate or the microwave power.

Additionally, in the present embodiment, it is also possible to generate hydrogen radicals by using an atmosphere including heavy nitrogen. In this case, heavy hydrogen radicals D* are formed in the atmosphere.

Further, the atmosphere including hydrogen radicals may include hydrogen ions.

Second Embodiment

Figure 6A:
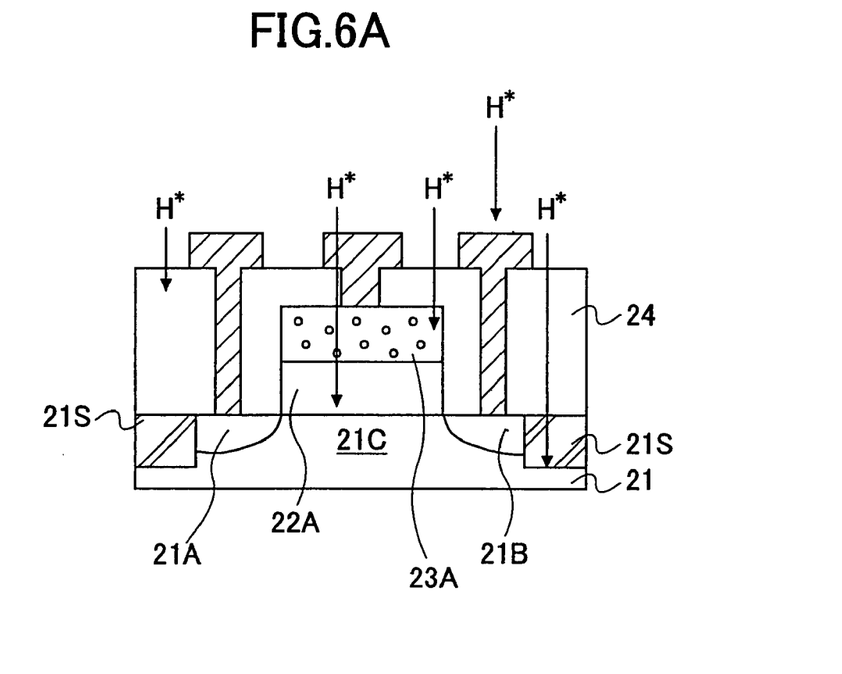
FIGS. 6A and 6B are diagrams for explaining a second embodiment of the present invention.
Figure 6B:
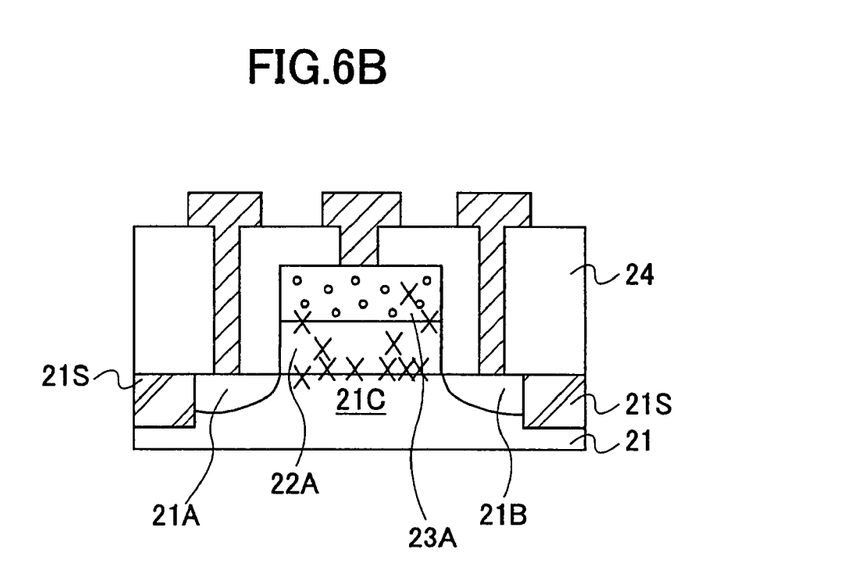

FIGS. 6A and 6B show a hydrogen sintering process according to one embodiment of the present invention, using the substrate processing apparatus 10 of FIG. 2. It should be noted that those parts that correspond to the above-described parts are designated by the same reference numerals, and a description thereof is omitted.

Referring to FIG. 6A, the silicon substrate 21 on which the semiconductor device structure of FIG. 1G is formed is introduced into the process chamber 11 of the substrate processing apparatus 10 as the substrate W to be processed. A mixed gas of a noble gas such as Ar or Kr and hydrogen is introduced from the shower plate 14, and is excited with microwaves of 2.45 GHz or 8.3 GHz. Thereby, hydrogen radicals H* are formed.

For example, by reducing the processing pressure of the process chamber 11 to 67 Pa, setting the substrate temperature to 250° C., and supplying hydrogen gas and Ar gas into the process chamber 11 such that the ratio of $H_2$ becomes 1% ($H_2$/Ar=1%), an atmosphere including Ar plasma and hydrogen radicals H* is formed underneath the shower plate 14.

The hydrogen radicals H* thus formed easily enter the polysilicon gate electrode 23A and terminate dangling bonds in the polysilicon gate electrode 23A. Further, the hydrogen radicals H* thus formed pass through the polysilicon film 23, reach inside the oxide film, the interface between the polysilicon film and the oxynitride film, or the interface between the oxide film and the silicon substrate, and terminate dangling bonds that exist in these regions, which dangling bonds are indicated by X. As a result, according to the present invention, similar to effects obtained by a hydrogen sintering process by heat, dangling bonds observed as a capacitance in the gate voltage range of −5 V to +5 V are terminated, and the interface state density associated with such dangling bonds is decreased.

It should be noted that, also in the present embodiment, it is possible to perform a restoring process of an interface by using heavy hydrogen radicals by supplying a mixed gas of hydrogen and heavy hydrogen or heavy hydrogen to the substrate processing apparatus 10 of FIG. 2.

In the present embodiment, the gate insulation film 22A of the MOSFET is formed by a thermal oxidation method. However, the gate insulation film 22A may be formed by any of, for example, plasma oxidation, plasma nitriding, catalytic oxidation, catalytic nitriding, CVD (Chemical Vapor Deposition), and PVD (Physical Vapor Deposition).

Figure 7:
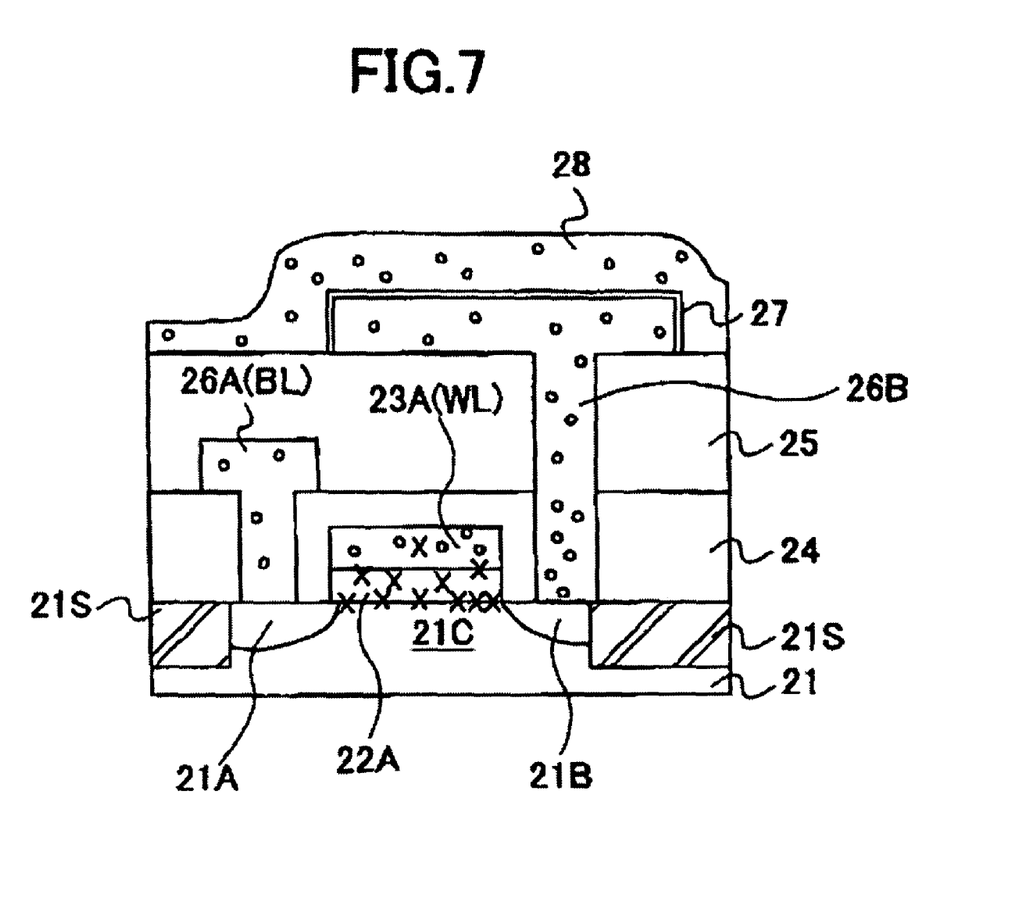
FIG. 7 is a diagram showing a case where the present invention is applied to a DRAM.

FIG. 7 shows a DRAM formed by applying a substrate processing method of the present invention. It should be noted that, in FIG. 7, those parts that are described above are designated by the same reference numerals, and a description thereof is omitted.

Referring to FIG. 7, in the present embodiment, the gate electrode 23A extends on the surface of the substrate 21 as a word line WL, and a polysilicon electrode pattern 26A, which is formed on the interlayer insulation film 24 and forming a bit line BL, contacts the diffusion region 21A, which forms a source region, via the contact hole formed in the interlayer insulation film 24.

Additionally, another interlayer insulation film is formed on the interlayer insulating film 24 so as to cover the bit line pattern 26A. A polysilicon electrode pattern, which forms a storage electrode 26B of a memory cell capacitor, is formed on the interlayer insulation film 24 such that the polysilicon electrode pattern contacts the diffusion region 21B via a contact hole formed to penetrate the interlayer insulation films 24 and 25.

A surface of the storage electrode 26B is covered with a high dielectric capacitor insulation film 27. In addition, an opposing electrode 28 is formed on the interlayer insulation film 25 so as to cover the capacitor insulation film 27.

Also in the DRAM of FIG. 7, similar to FIG. 6B, it is possible to terminate with hydrogen radicals H* the dangling bonds that exist in the vicinity of the interface between the silicon substrate 21 and the gate insulation film 22A, inside the gate insulation film 22A or the polysilicon electrode 23A, or in the vicinity of the interface between the gate insulation film 22A and the polysilicon electrode 23A by plasma processing by the substrate processing apparatus of FIG. 2. Thus, it is possible to obtain a DRAM having stable characteristics.

The description is given above of the preferred embodiments of the present invention. However, the present invention is not limited to the specifically disclosed embodiments, and variations and modifications may be made without departing from the scope of the claims.

According to the present invention, in a substrate for an electronic device including a semiconductor device whose characteristics may be degraded by high temperature processing, by performing a hydrogen sintering process with the use of microwave plasma having a high electron density, it is possible to improve electric properties of the semiconductor device while maintaining the substrate temperature to be low. In addition, by propagating microwaves via a planar antenna, it is possible to achieve low electron temperature and prevent damage on the semiconductor device due to plasma damage. Further, since microwaves are emitted through propagation via the planar antenna, it is possible to process a large area in proportion to the area of the antenna. Thus, application to a substrate having a large area such as a wafer having a diameter of 300 mm and a TFT substrate having a large area becomes easy.

The present invention is based on Japanese Patent Application No. 2001-394546 filed Dec. 26, 2001, and including its specification, claims, drawings, and abstract. The disclosure of the above application is incorporated herein by reference in its entirety.

We claim:

1. A hydrogen sintering apparatus that applies a hydrogen sintering process to an electronic device substrate on which a semiconductor device is already formed, said electronic device substrate being selected from the consisting of a Si substrate, a SiGe substrate, and a glass substrate, comprising:
   a processing vessel accommodating therein a stage for holding said electronic device substrate thereon, said processing vessel being evacuated at an evacuation port provided thereon;
   a cover plate provided in a part of said processing vessel so as to face said electronic device substrate on said stage;
   gas nozzle openings introducing a mixed gas of a noble gas and a hydrogen gas into said processing vessel; and
   a planar antenna provided outside of said cover plate, said planar antenna emitting a microwave therefrom,
   wherein said hydrogen sintering apparatus generates an atmosphere comprising hydrogen radicals and hydrogen ions by exciting said mixed gas into a plasma with said microwave by radiating said microwave to said mixed gas of said noble gas and said hydrogen gas by said planar antenna, and
   said hydrogen sintering apparatus applies said hydrogen sintering process to said electronic device substrate by exposing said electronic device substrate to said hydrogen radicals and said hydrogen ions under a pressure of 13.3 to 267 Pa and a temperature of 600° C. or lower.

2. The apparatus as claimed in claim 1, wherein said semiconductor device includes a MOSFET and a DRAM.

3. A hydrogen sintering apparatus that applies a hydrogen sintering process to an electronic device substrate, said electronic device substrate being selected from the group consisting of a Si substrate, a SiGe substrate, and a glass substrate, comprising:
   a processing vessel accommodating therein a stage for holding said electronic device substrate thereon, said processing vessel being evacuated at an evacuation port provided thereon;
   a cover plate provided in a part of said processing vessel so as to face said electronic device substrate on said stage;
   gas nozzle openings introducing a mixed gas of a noble gas and a hydrogen gas into said processing vessel; and
   a planar antenna provided outside of said cover plate, said planar antenna emitting a microwave therefrom,
   wherein said hydrogen sintering apparatus generates an atmosphere comprising hydrogen radicals and hydrogen ions by radiating said microwave to said mixed gas of said noble gas and said hydrogen gas by said planar antenna, and
   said hydrogen sintering apparatus applies said hydrogen sintering process to said electronic device substrate by exposing said electronic device substrate to said hydrogen radicals and said hydrogen ions.

* * * * *